United States Patent
Daibou et al.

(10) Patent No.: US 8,686,521 B2
(45) Date of Patent: Apr. 1, 2014

(54) MAGNETORESISTIVE ELEMENT AND MAGNETIC MEMORY

(75) Inventors: Tadaomi Daibou, Kawasaki (JP); Toshihiko Nagase, Yokohama (JP); Eiji Kitagawa, Yokohama (JP); Masatoshi Yoshikawa, Yokohama (JP); Katsuya Nishiyama, Yokohama (JP); Makoto Nagamine, Komae (JP); Tatsuya Kishi, Yokohama (JP); Hiroaki Yoda, Sagamihara (JP)

(73) Assignee: Kabushiki Kaisha Toshiba, Tokyo (JP)

(*) Notice: Subject to any disclaimer, the term of this patent is extended or adjusted under 35 U.S.C. 154(b) by 605 days.

(21) Appl. No.: 12/716,582

(22) Filed: Mar. 3, 2010

(65) Prior Publication Data

US 2010/0244163 A1 Sep. 30, 2010

(30) Foreign Application Priority Data

Mar. 30, 2009 (JP) ................. 2009-082741

(51) Int. Cl.
*H01L 29/82* (2006.01)

(52) U.S. Cl.
USPC ........................ 257/421; 360/324.1

(58) Field of Classification Search
USPC ........................ 257/421; 360/324.1
See application file for complete search history.

(56) References Cited

U.S. PATENT DOCUMENTS

| | | | |
|---|---|---|---|
| 6,607,641 B2 * | 8/2003 | Saito et al. | 204/192.2 |
| 7,663,197 B2 * | 2/2010 | Nagase et al. | 257/421 |
| 2003/0184921 A1 * | 10/2003 | Sugita et al. | 360/324.1 |
| 2006/0291105 A1 * | 12/2006 | Chang et al. | 360/324.2 |
| 2007/0206333 A1 * | 9/2007 | Watanabe et al. | 360/313 |
| 2008/0231998 A1 | 9/2008 | Yoshikawa et al. | |
| 2009/0080238 A1 | 3/2009 | Yoshikawa et al. | |
| 2009/0251951 A1 | 10/2009 | Yoshikawa et al. | |

OTHER PUBLICATIONS

U.S. Appl. No. 13/043,064, filed Mar. 8, 2011, Daibou, et al.
U.S. Appl. No. 12/686,168, filed Jan. 12, 2010, Toshihiko Nagase et al.
Till Burkert, et al., "Giant Magnetic Anisotropy in Tetragonal FeCo Alloys", Physical Review Letter, Jul. 9, 2004, vol. 93, No. 2, pp. 027203-1-027203-4.
F. Luo et al., "Tuning the perpendicular magnetic anisotropy in tetragonally distorted $Fe_xCo_{1-x}$ alloy films on Rh (001) by varying the alloy composition", Applied Physics Letters, vol. 91, 2007, pp. 262512-1-262512-3.

(Continued)

*Primary Examiner* — Thao Le
*Assistant Examiner* — Geoffrey Ida
(74) *Attorney, Agent, or Firm* — Oblon, Spivak, McClelland, Maier & Neustadt, L.L.P.

(57) ABSTRACT

A magnetoresistive element includes a stabilization layer, a nonmagnetic layer, a spin-polarization layer provided between the stabilization layer and the nonmagnetic layer, the spin-polarization layer having magnetic anisotropy in a perpendicular direction, and a magnetic layer provided on a side of the nonmagnetic layer opposite to a side on which the spin-polarization layer is provided. The stabilization layer has a lattice constant smaller than that of the spin-polarization layer in an in-plane direction. The spin-polarization layer contains at least one element selected from a group consisting of cobalt (Co) and iron (Fe), has a body-centered tetragonal (BCT) structure, and has a lattice constant ratio c/a of 1.10 (inclusive) to 1.35 (inclusive) when a perpendicular direction is a c-axis and an in-plane direction is an a-axis.

18 Claims, 5 Drawing Sheets

(56) References Cited

OTHER PUBLICATIONS

R. People et al., "Calculation of critical layer thickness versus lattice mismatch for $Ge_xSi_{1-x}$/Si strained-layer heterostructures", Applied Physics Letters, vol. 47, No. 3, Aug. 1, 1985, pp. 322-324.

J. W. Mathews et al., "Defects in Epitaxial Multilayers", Journal of Crystal Growth, vol. 27, 1974, pp. 118-125.

W.H. Butler et al., "Spin-dependent tunneling conductance of Fe | MgO | Fe sandwiches", Physical Review B, vol. 63, 2001, pp. 054416-1-054416-12.

Patric Bruno, "Tight-binding approach to the orbital magnetic moment and magnetocrystalline anisotropy of transition-metal monolayers", Physical Review B, vol. 39, No. 1, Jan. 1, 1989, pp. 865-868.

U.S. Appl. No. 12/885,833, filed Sep. 20, 2010, Inokuchi, et al.

* cited by examiner

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2009-082741, filed Mar. 30, 2009, the entire contents of which are incorporated herein by reference.

BACKGROUND OF THE INVENTION

1. Field of the Invention

The present invention relates to a magnetoresistive element and a magnetic memory using the same.

2. Description of the Related Art

Recently, techniques (spin electronics) using the degree of freedom of an electron spin are being studied. The state density of a ferromagnetic material polarizes near the Fermi surface for each of electrons having up-spin and down-spin. Electrons near the Fermi energy are conducted, and the conductive electrons and spin are hybridized in a ferromagnetic material. An electric current is presumably spin-polarized because the spin has itinerancy. When a ferromagnetic material is regarded as a spin injection source, the possibility of the construction of a high-level function device using the degree of freedom of spin greatly expands.

In addition, nanomaterial design has presently become possible as the deposition techniques and micropatterning techniques advance. When a hybrid structure having a ferromagnetic material is artificially formed in a nanoscale region, the quantum interference effect appears, and many physical phenomena unobservable in any single substance are observed. In particular, a magnetic tunnel junction (MTJ) element as a magnetoresistive element has a basic structure including a first ferromagnetic layer, tunnel barrier layer, and second ferromagnetic layer, and shows the tunneling magnetoresistive (TMR) effect. This MTJ element has been applied to a head for a 100-Mbpsi [bits per square inch] class HDD or a magnetic random access memory (MRAM).

The MRAM stores a binary digit (1 or 0) by using the change in relative angle of the magnetization in the magnetic layer included in the MTJ element, and hence is nonvolatile. Also, since the magnetization switching speed is a few nanoseconds, the MRAM is capable of high-speed data write and read. Accordingly, the MRAM is expected as a next-generation high-speed nonvolatile memory. Furthermore, when using a method called spin transfer magnetization reversal that controls magnetization by using a spin-polarized current, the current density is increased by decreasing the cell size of the MRAM. This makes it possible to readily reverse the magnetization of a magnetic material, and achieve a high-density and low-power-consumption MRAM.

In addition, it is recently theoretically demonstrated that a magnetoresistive ratio of 1,000% is obtained by using MgO as a tunnel barrier layer, and this demonstration is attracting attention (e.g., reference 1: Butler W. H., Zhang X. G., Shulthess T. C., MacLaren J. M., "Spin-dependent tunneling conductance of Fe/MgO/Fe sandwiches", Phys. Rev. B, Vol. 63, 054416 [2001]). That is, when MgO is crystallized, only electrons having a specific wave number can selectively be conducted by tunneling into the MgO from a ferromagnetic layer while maintaining the wave number. In this state, a giant magnetoresistive effect appears because the spin polarization ratio is large in a specific crystal orientation. Therefore, increasing the magnetoresistive effect of the MTJ element directly leads to a high density and low power consumption of the MRAM.

On the other hand, increasing the integration degree of a magnetoresistive element is essential in increasing the density of a nonvolatile memory. However, a ferromagnetic material forming a magnetoresistive element decreases the heat disturbance resistance as the element size decreases. Accordingly, it is important to improve the magnetic anisotropy and heat disturbance resistance of a ferromagnetic material. In an in-plane magnetization MTJ element, the magnetization of a ferromagnetic material points in the direction of the plane of the element. To increase the integration degree by using this in-plane magnetization MTJ element, attempts have been made to increase the magnetic anisotropy by using the magnetic shape anisotropy. Since the heat disturbance resistance is sensitive to the element shape, however, the processing accuracy is a factor of the characteristic distribution. Also, to achieve the magnetic shape anisotropy, a general approach is to extend the element shape in a specific direction in the plane. Unfortunately, this method is unsuitable to increasing the integration degree because the area occupied by the element increases.

To solve this problem, attempts have recently been made to construct an MRAM using a perpendicular magnetization MTJ element in which the magnetization of a ferromagnetic material points in a direction perpendicular to the film surface. In the perpendicular magnetization MTJ element, a material having large magnetocrystalline anisotropy is generally used as the ferromagnetic material. Since the magnetization of this material points in a specific crystal direction, the magnitude of magnetocrystalline anisotropy can be controlled by changing the composition ratio and crystallinity of the constituent elements. Accordingly, the direction of magnetization can be controlled by changing the crystal growth direction. Also, since the ferromagnetic material itself has high magnetocrystalline anisotropy, the aspect ratio of the element can be set to 1. In addition, the element is suitable to increasing the integration degree because the heat disturbance resistance is high. When these factors are taken into consideration, it is very important to form a perpendicular magnetization MTJ element having a large magnetoresistive effect in order to achieve a high integration degree and low power consumption of the MRAM.

BRIEF SUMMARY OF THE INVENTION

According to an aspect of the present invention, there is provided a magnetoresistive element comprising:

a stabilization layer;

a nonmagnetic layer;

a spin-polarization layer provided between the stabilization layer and the nonmagnetic layer, the spin-polarization layer having magnetic anisotropy in a perpendicular direction; and a magnetic layer provided on a side of the nonmagnetic layer opposite to a side on which the spin-polarization layer is provided, wherein the stabilization layer has a lattice constant smaller than that of the spin-polarization layer in an in-plane direction, and the spin-polarization layer contains at least one element selected from a group consisting of cobalt (Co) and iron (Fe), has a body-centered tetragonal (BCT) structure, and has a lattice constant ratio c/a of 1.10 (inclusive) to 1.35 (inclusive) when a perpendicular direction is a c-axis and an in-plane direction is an a-axis.

According to an aspect of the present invention, there is provided a magnetoresistive element comprising:

first and second stabilization layers;

a nonmagnetic layer;

a first spin-polarization layer provided between the first stabilization layer and the nonmagnetic layer, the first spin-polarization layer having magnetic anisotropy in a perpendicular direction; and a second spin-polarization layer provided between the second stabilization layer and the nonmagnetic layer, the second spin-polarization layer having magnetic anisotropy in a perpendicular direction, wherein the first stabilization layer has a lattice constant smaller than that of the first spin-polarization layer in an in-plane direction, the second stabilization layer has a lattice constant smaller than that of the second spin-polarization layer in an in-plane direction, and each of the first and second spin-polarization layers contains at least one element selected from a group consisting of cobalt (Co) and iron (Fe), has a body-centered tetragonal (BCT) structure, and has a lattice constant ratio c/a of 1.10 (inclusive) to 1.35 (inclusive) when a perpendicular direction is a c-axis and an in-plane direction is an a-axis.

According to an aspect of the present invention, there is provided a magnetic memory comprising a memory cell comprising one of the above-mentioned magnetoresistive elements.

DETAILED DESCRIPTION OF THE INVENTION

Figure 1:
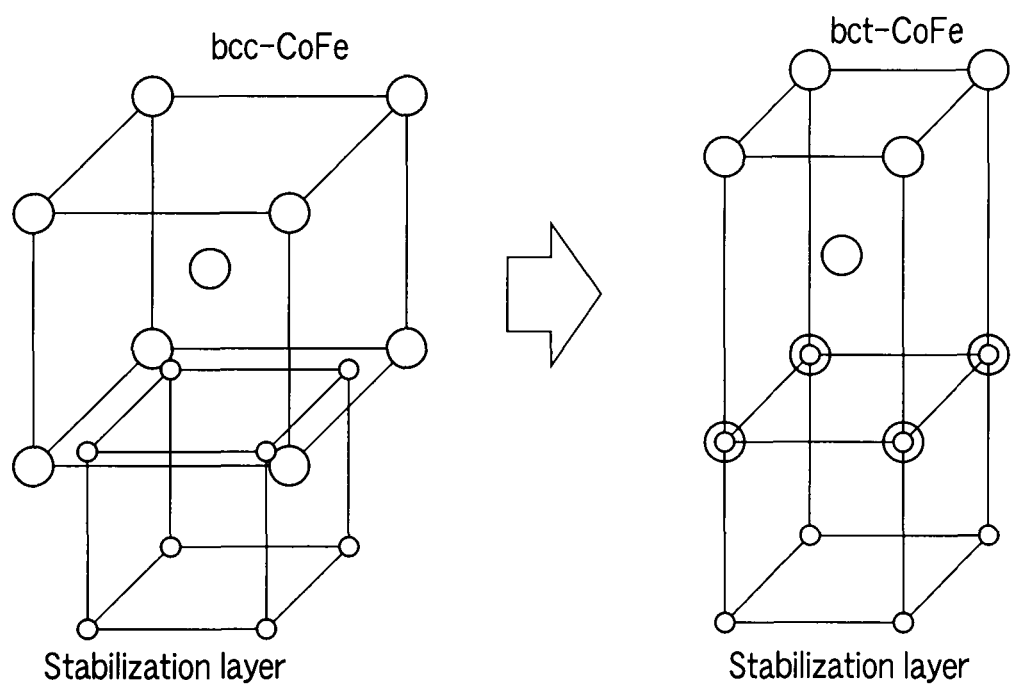
FIG. 1 is a view illustrating the way the unit lattice of a spin-polarization layer changes.

The embodiments of the present invention will be described hereinafter with reference to the accompanying drawings. In the description which follows, the same or functionally equivalent elements are denoted by the same reference numerals, to thereby simplify the description.

First Embodiment

1. Principle

The TMR effect is sensitive to the spin polarization ratio of the interface between a tunnel barrier layer and ferromagnetic layer. This is so because carriers that tunnel into the tunnel barrier layer are electrons near the interface and hence the spin polarization ratio is related to the interface electron state. To achieve a large TMR effect, therefore, it is possible to insert a material having a high spin polarization ratio in the interface between the tunnel barrier layer and ferromagnetic layer. When the magnetization of the ferromagnetic layer in contact with a spin-polarization layer having a high spin polarization ratio is perpendicular to the film surface and the spin-polarization layer is sufficiently thin, the magnetization of the spin-polarization layer becomes perpendicular to the film surface under the influence of the magnetic interaction of the ferromagnetic layer. When the spin-polarization layer is thin, however, the magnetoresistive ratio decreases because the interface spin polarization ratio decreases.

On the other hand, when the thickness of the spin-polarization layer is increased in order to increase the interface spin polarization ratio, the magnetization of the spin-polarization layer becomes parallel to the film surface because the influence of the magnetic interaction from the magnetic layer decreases. The present invention can increase the thickness of the spin-polarization layer by giving high magnetocrystalline anisotropy to the spin-polarization layer itself having a high spin polarization ratio. This makes it possible to fabricate a perpendicular magnetization MTJ element having a high magnetoresistive ratio while maintaining the perpendicular magnetization.

Since the spin magnetic moment and orbital magnetic moment are bound by the spin orbital interaction, the magnetic anisotropy of a magnetic layer directly depends on the anisotropy of the orbital magnetic moment. When the spin-polarization layer is made of a CoFe alloy, d electrons have anisotropy in the unit lattice, so the spatial distribution of the d electrons is directly related to the magnetic anisotropy of the CoFe alloy. As pointed out by reference 2 (Patrick Bruno, "Tight-binding approach to the orbital magnetic moment and magnetocrystalline anisotropy of transition-metal monolayers", Phys. Rev. B, Vol. 39, 865-868 [1989]), the magnetic anisotropic energy is inversely proportional to the energy difference between an occupied $d_{XY}$ orbit and unoccupied $d_{X2-Y2}$ orbit. The $d_{XY}$ orbit and $d_{X2-Y2}$ orbit respectively belong to the $t_{2g}$ orbit and $e_g$ orbit, and their energies meet condition $E(t_{2g}) < E(e_g)$. The individual orbits degenerate triple and double, but the degeneration is loosened by the strain of the crystal lattice. Letting a be a lattice constant in the x-axis direction and c be a lattice constant in the z-axis direction, the $d_{XY}$ orbit monotonically increases and the $d_{X2-Y2}$ orbit monotonically decreases as a lattice constant ratio c/a increases. Accordingly, the energy levels match when c/a≈1.2.

On the other hand, the Fermi level of the CoFe alloy depends on the number of electrons. When the composition of the CoFe alloy is $Co_xFe_{1-x}$ (X≈0.5), the Fermi level intercepts an energy level intermediate between the $d_{XY}$ orbit and $d_{X2-Y2}$ orbit. In the d-electron distribution, therefore, the $d_{XY}$ orbit is occupied by electrons, and the $d_{X2-Y2}$ orbit is not occupied by electrons. Accordingly, the magnetic anisotropy of CoFe is maximum in this state.

To allow the spin-polarization layer to exhibit high perpendicular magnetic anisotropy, a tetragonal structure must be implemented, so it is important to strain the crystal structure in the z-axis direction. The crystal structure is generally controlled by adjusting the composition of the constituent elements. In a $Co_xFe_{1-x}$ alloy, for example, as the Co concentration increases, a body-centered cubic (BCC) structure changes into a face-centered cubic (FCC) structure around X=0.75. The crystal structure and lattice constant can be controlled by thus changing the composition of the CoFe alloy, but the cubic lattice is maintained.

In this embodiment, however, as shown in FIG. 1, a stabilization layer having a lattice constant smaller than that of the spin-polarization layer is brought into contact with the spin-polarization layer, thereby compressing the crystal lattice of the spin-polarization layer in the x- and y-axis directions. Since this holds the atomic density per unit lattice constant, the spin-polarization layer extends perpendicularly to the film surface. That is, the CoFe alloy is stabilized as a body-centered tetragonal (BCT) structure obtained by extending the BCC structure in the z-axis direction, thereby achieving c/a>1. As described above, this embodiment causes the spin-polarization layer itself to exhibit the perpendicular magnetic anisotropy by the spin reorientation transition (SRT) effect by controlling the lattice constant ratio c/a and composition of the spin-polarization layer.

2. Structure of Magnetoresistive Element (MTJ Element)

Figure 2:
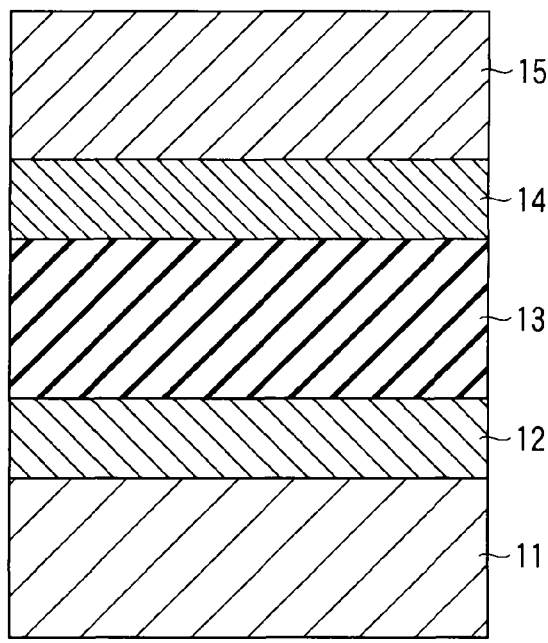
FIG. 2 is a sectional view illustrating the structure of an MTJ element 10 according to a first embodiment.

FIG. 2 is a sectional view showing the structure of an MTJ element 10 according to the first embodiment of the present invention. The MTJ element 10 is formed by sequentially stacking a first stabilization layer 11, first spin-polarization layer 12, nonmagnetic layer 13, second spin-polarization layer 14, and second stabilization layer 15.

The spin-polarization layers 12 and 14 each have magnetic anisotropy perpendicular to the film surface, and the direction of easy magnetization is also perpendicular to the film surface. That is, the MTJ element 10 is a so-called perpendicular magnetization MTJ element in which the magnetization directions in the first and second spin-polarization layers 12 and 14 are perpendicular to the film surface. Note that the direction of easy magnetization is a direction in which, in a ferromagnetic material having a certain macrosize, the internal energy becomes lowest if the spontaneous magnetization points in that direction with no external magnetic field being applied. The direction of hard magnetization is a direction in which, in a ferromagnetic material having a certain macrosize, the internal energy becomes highest if the spontaneous magnetization points in that direction with no external magnetic field being applied.

To allow each of the spin-polarization layers 12 and 14 to exhibit high perpendicular magnetic anisotropy as described above, the spin-polarization layer is strained in the z-axis direction. This gives the spin-polarization layers 12 and 14 the BCT structure obtained by extending the BCC structure in the z-axis direction. At the same time, the composition ratio of each of the spin-polarization layers 12 and 14 is set within the range in which the magnetocrystalline anisotropy increases. This composition ratio will be described later. As a consequence, the spin-polarization layers 12 and 14 each exhibit the perpendicular magnetic anisotropy. Accordingly, the spin-polarization layers 12 and 14 can be used as magnetic layers forming the perpendicular magnetization MTJ element 10.

Also, the spin-polarization layers 12 and 14 are made of a highly spin-polarization material. This makes it possible to increase the spin polarization ratio of the interface between the nonmagnetic layer (tunnel barrier layer) 13 and spin-polarization layer 12. Similarly, the spin polarization ratio of the interface between the nonmagnetic layer (tunnel barrier layer) 13 and spin-polarization layer 14 can be increased. Consequently, the MTJ element 10 can exhibit a large TMR effect, and can increase the magnetoresistive ratio.

The stabilization layers 11 and 15 respectively stabilize the crystal structures of the spin-polarization layers 12 and 14. That is, the lattice constant of the stabilization layer 11 in the in-plane direction is set smaller than that of the spin-polarization layer 12, so the stabilization layer 11 stabilizes the spin-polarization layer 12 formed above the stabilization layer 11 and compressed in the in-plane direction by giving the BCT structure to the spin-polarization layer 12. Likewise, the lattice constant of the stabilization layer 15 in-plane direction is set smaller than that of the spin-polarization layer 14, so the stabilization layer 15 stabilizes the spin-polarization layer 14 formed below the stabilization layer 15 and compressed in the direction parallel to the film surface by giving the BCT structure to the spin-polarization layer 14.

Figure 3:
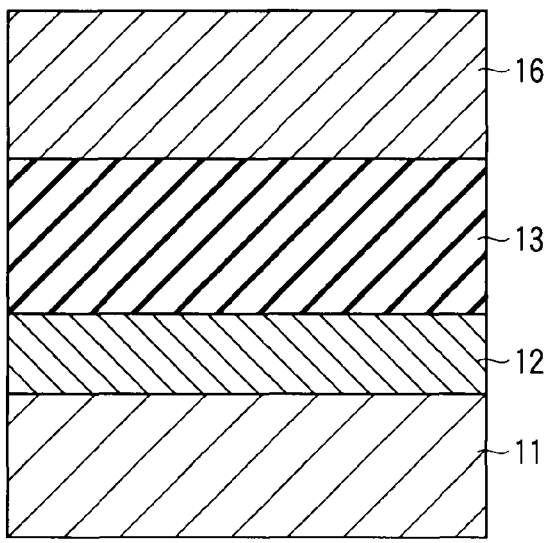
FIG. 3 is a sectional view illustrating another structural example of the MTJ element 10.

FIG. 3 is a sectional view showing another structural example of the MTJ element 10. The MTJ element 10 is formed by sequentially stacking a stabilization layer 11, spin-polarization layer 12, nonmagnetic layer 13, and magnetic layer 16.

The magnetic layer 16 has the perpendicular magnetic anisotropy. A ferromagnetic alloy or a metal capable of forming an $L1_0$ alloy is used as the magnetic layer 16. The material of the magnetic layer 16 mainly contains an alloy containing one or more elements selected from the first group consisting of iron (Fe), cobalt (Co), nickel (Ni), and copper (Cu), and one or more elements selected from the second group consisting of platinum (Pt), palladium (Pd), rhodium (Rh), and gold (Au). Practical examples are ferromagnetic alloys such as FeRh, FePt, FePd, CoPt, and NiPt.

In the MTJ element 10 shown in FIG. 3, the magnetic layer 16 itself having the perpendicular magnetic anisotropy functions as a ferromagnetic electrode. This obviates the need to insert any spin-polarization layer adjacent to the magnetic layer 16. Even when using the structure as shown in FIG. 3, the perpendicular magnetization MTJ element 10 having a high magnetoresistive ratio can be implemented. Note that it is also possible to adopt an MTJ element having a structure in which the layers forming the MTJ element 10 shown in FIG. 3 are stacked in the opposite order. Even in these cases, it is possible to exhibit a large TMR effect by stabilizing the BCT structure, and increase the magnetoresistive ratio.

Practical arrangements of the layers included in the MTJ element 10 will be explained below in the order of the spin-polarization layers 12 and 14, stabilization layers 11 and 15, and nonmagnetic layer 13.

3. Arrangement of Spin-Polarization Layers 12 & 14

When using, e.g., a CoFe alloy as the spin-polarization layer, the magnetocrystalline anisotropy increases when the lattice constant ratio c/a of the CoFe alloy is 1.10 (inclusive) to 1.35 (inclusive) and the composition is $Co_XFe_{1-X}$ (0.4≤X≤0.6) (see FIG. 1 of reference 3 [Till Burkert et al., "Giant Magnetic Anisotropy in Tetragonal FeCo Alloys", Phys. Rev. Let., Vol. 93, No. 2, 027203-1-027203-4, 9 Jul. 2004]). Under the conditions by which the magnetocrystalline anisotropy is large, the lattice constant a of the CoFe alloy having the BCT structure for generating strain is estimated. Let aCoFe be the lattice constant of the CoFe alloy having the BCC structure.

Letting a, b, and c respectively be the lattice constants in the x-, y-, and z-axis (also called a-, b-, and c-axis) directions, the lattice constants of the three axes are equal in the BCC structure. Therefore, condition a=b=c=aCoFe holds. When the unit lattice is evenly compressed by, e.g., applying a pressure in the in-plane direction, the lattice constants a and b become smaller and equal, so condition a=b=a1 holds. In this condition, a1 is the lattice constant in the x-axis direction after the unit lattice is compressed.

On the other hand, the pressurized unit lattice tends to hold the volume per lattice constant, and presumably extends in the z-axis direction. Letting d be the extension rate, condition c=d×a1 holds. Since the magnetocrystalline anisotropy is maximum when the lattice constant ratio c/a is 1.10≤c/ a≤1.35, the extension rate d is 1.10≤d≤1.35. Accordingly, from condition (aCoFe)×(aCoFe)×(aCoFe)=a1×a1×(d×a1) by which the volume is constant, a1 is estimated as a1=aCoFe/d$^{1/3}$. Therefore, the value of a1 at which the magnetocrystalline anisotropy is maximum is aCoFe×0.905 Å≤a1≤aCoFe×0.969 Å.

On the other hand, the magnetocrystalline anisotropy of the CoFe alloy having the BCT structure depends on the composition ratio, and is maximum when the composition ratio is $Co_XFe_{1-X}$ (0.4≤X≤0.6). The lattice constant of the CoFe alloy is 2.843 Å≤aCoFe≤2.854 Å when 0.4≤X≤0.6. Therefore, the spin-polarization layer exhibits large magnetic anisotropy when the lattice constant of the CoFe alloy having the BCT structure is set to 2.573 Å≤a≤2.766 Å.

The magnetocrystalline anisotropy of the spin-polarization layer can be controlled by adjusting the composition of the CoFe alloy having the BCT structure. Accordingly, it is possible to form a magnetoresistive element having the spin-polarization layers 12 and 14 different in coercive force by using CoFe alloys having different composition ratios as the spin-polarization layers 12 and 14. Also, when giving the BCT structure to the spin-polarization layer by forming it adjacent to the stabilization layer, the magnetocrystalline anisotropy of the spin-polarization layer strongly depends on its thickness. This is so because a thickness by which the spin-polarization layer keeps exhibiting the magnetocrystalline anisotropy corresponds to a thickness by which the spin-polarization layer can hold the BCT structure. From this point of view, it is possible to form a magnetoresistive element having the spin-polarization layers 12 and 14 different in coercive force by adjusting the thicknesses of the spin-polarization layers 12 and 14. Note that in order to control the lattice constant of the CoFe alloy, it is also possible to add, to the CoFe alloy, at least one element of nickel (Ni), tantalum (Ta), chromium (Cr), boron (B), phosphorus (P), carbon (C), silicon (Si), molybdenum (Mo), and zirconium (Zr).

If the thicknesses of the spin-polarization layers 12 and 14 are too small, the spin-polarization layers cannot maintain the bulk electron state. Therefore, the spin-polarization layers 12 and 14 each require a thickness equivalent to at least one unit lattice. For example, the unit lattice of an iron (Fe) BCC structure is equivalent to two atomic layers, and the lattice constant is 0.28 nm. Accordingly, the lower limit of the spin-polarization layers 12 and 14 is desirably 0.28 nm or more.

If lattice misfit exists between the spin-polarization layer and stabilization layer, the spin-polarization layer causes pseudo-lattice matching by following the lattice of the stabilization layer when the spin-polarization layer is sufficiently thin. If the thickness of the spin-polarization layer is large, however, dislocation occurs in the interface between the spin-polarization layer and stabilization layer in order to reduce the energy of the lattice strain. Accordingly, a critical thickness by which no dislocation occurs and the pseudo-lattice matching can be maintained is the thickness by which the spin-polarization layer can hold the strain. This critical thickness is equivalent to the upper limit of the thickness of each of the spin-polarization layers 12 and 14. Lattice misfit required to achieve the perpendicular magnetic anisotropy when the spin-polarization layer is brought into contact with the stabilization layer and strained is about 3% or more. A force for affecting the dislocation is calculated by the energy equilibrium theory (reference 4 [R. People and J. C. Bean, "Calculation of critical layer thickness versus lattice mismatch for $Ge_xSi_{1-x}$/Si strained-layer heterostructures", Appl. Phys. Lett. 47 (1985), pp. 322-324]) and the dynamic equilibrium theory (reference 5 [J. W. Mathews and A. E. Blakeslee, "Defects in epitaxial multilayers. I. Misfit dislocations", J. Cryst. Growth 27 (1974), pp. 118-125]). From the calculation, the critical thickness when the lattice misfit is 3% is approximately 3 nm. From this point of view, the upper limit of the thickness of each of the spin-polarization layers 12 and 14 is desirably 3 nm.

In this embodiment as described above, the crystal structure of the CoFe alloy is strained, and the number of electrons is controlled by adjusting the composition of Co and Fe, thereby achieving the perpendicular magnetic anisotropy by the magnetocrystalline anisotropy. On the other hand, an artificial lattice made of a multilayered film obtained by alternately stacking about ten ferromagnetic layers containing Ni, Fe, Co, or the like and about ten nonmagnetic layers containing Pt, Cu, Pd, or the like is found to have the perpendicular magnetic anisotropy. However, the origins of the perpendicular magnetic anisotropy of the artificial lattice are the interface anisotropy and surface anisotropy of the ferromagnetic layer and nonmagnetic layer. Accordingly, although the perpendicular magnetic anisotropy is observed when, e.g., Co and Pt are alternately stacked, the perpendicular magnetic anisotropy of the artificial lattice of Co and Pt disappears unless the thickness of the ferromagnetic layer Co is 1 nm or less.

In this embodiment, however, the strain of the CoFe alloy is the origin of the perpendicular magnetic anisotropy. Therefore, the perpendicular magnetic anisotropy can be kept exhibited even with a thickness of about 3 nm at which the strain of the CoFe alloy can be maintained. As described above, the spin-polarization layer of this embodiment and the artificial lattice are essentially different in origin of the perpendicular magnetic anisotropy.

If the thickness of the stabilization layer is too small, a discontinuous film is formed. This discontinuous film cannot function as the stabilization layer because it cannot strain the spin-polarization layer. If the thickness of the stabilization layer is too large, the surface flatness worsens. Therefore, the thickness of the stabilization layer is desirably about 1 to 10 nm.

(Materials of Spin-Polarization Layers 12 & 14)

The spin-polarization layers 12 and 14 of this embodiment are made of a ferromagnetic material mainly containing cobalt (Co) and iron (Fe). To control the lattice constant of the spin-polarization layer, it is also possible to add one or more elements selected from nickel (Ni), tantalum (Ta), chromium (Cr), boron (B), phosphorus (P), carbon (C), silicon (Si), molybdenum (Mo), and zirconium (Zr) at a concentration of 25 at % or less. The spin polarization ratio can be controlled by using any of these materials as the spin-polarization layer.

Furthermore, to increase the magnetic anisotropy of the spin-polarization layer itself, one or more elements selected from platinum (Pt), palladium (Pd), rhodium (Rh), and gold (Au) may also be added.

The spin-polarization layer desirably has orientation by which the interface in contact with the nonmagnetic layer 13 is a (001) plane. That is, the spin-polarization layer 12 desirably has orientation by which its upper surface is a (001) plane. Also, the spin-polarization layer 14 desirably has orientation by which its bottom surface is a (001) plane.

When growing the nonmagnetic layer 13 (MgO) on the spin-polarization layer 12 (CoFe) whose upper surface is a (001) plane, it is possible to form MgO that is (001)-oriented in the direction perpendicular to the film surface. For example, in a structure including the first spin-polarization layer 12 (CoFe), nonmagnetic layer 13 (MgO), and second spin-polarization layer 14 (CoFe), an epitaxial relationship represented by CoFe(001)/MgO(001)/CoFe(001) can be formed. Since this improves the wave number selectively of tunnel electrons, a high magnetoresistive ratio can be obtained.

4. Arrangement of Stabilization Layers 11 & 15

As shown in FIG. 1, to implement the spin-polarization layer of this embodiment, the stabilization layer having a lattice constant smaller than that of the spin-polarization layer is brought into contact with the spin-polarization layer. Since this reduces the interface energy with respect to the stabilization layer, the lattice constant of the spin-polarization layer in the in-plane direction becomes smaller than the original value. In addition, the BCT structure stabilizes because the spin-polarization layer extends in the direction perpendicular to the film surface in order to hold the atomic density per unit lattice constant.

Each of the stabilization layers 11 and 15 has a cubic crystal or tetragonal crystal as the primitive lattice, and is (001)-oriented in the direction perpendicular to the film surface. Note that the stabilization layer 11 need not entirely be (001)-oriented in the directly perpendicular to the film surface, and at least its upper surface in contact with the spin-polarization layer 12 need only be (001)-oriented in the direction perpendicular to the film surface. Similarly, at least the bottom surface of the stabilization layer 15, which is in contact with the spin-polarization layer 14, need only be (001)-oriented in the direction perpendicular to the film surface.

On the stabilization layer whose upper surface is (001)-oriented in the direction perpendicular to the film surface, the crystal grains of the spin-polarization layer are (001)-oriented in the direction perpendicular to the film surface. By contrast, in the in-plane direction, the crystal grains of the spin-polarization layer grow at a rotational angle of 45° to the in-plane direction of the stabilization layer, i.e., the [001] direction. Accordingly, the stabilization layer and spin-polarization layer maintain epitaxial relationships represented by (001)//(001) and [001]//[110].

When a CoFe alloy having the BCT structure in which the composition is $Co_XFe_{1-X}$ (0.4≤X≤0.6) and the lattice constant ratio c/a is 1.10 (inclusive) to 1.35 (inclusive) is used as the spin-polarization layer, a lattice constant a0 in the in-plane direction (x-axis direction) of the stabilization layer required to stabilize the spin-polarization layer is estimated. Since the stabilization layer finally lattice-matches with the spin-polarization layer compressed in the in-plane direction, the lattice constant a0 can be calculated by using the lattice constant a1 of the spin-polarization layer. As described previously, the value of a1 at which the magnetocrystalline anisotropy of the spin-polarization layer is maximum is aCoFe×0.905 Å≤a1≤aCoFe×0.969 Å.

On the stabilization layer whose upper surface is (001)-oriented in the direction perpendicular to the film surface, the crystal grains of the spin-polarization layer are (001)-oriented in the direction perpendicular to the film surface, and, in the in-plane direction, grow at a rotational angle of 45° with respect to the in-plane direction of the stabilization layer, i.e., the [001] direction. This makes it necessary to take account of the lattice constant of the CoFe alloy in the [110] direction. Accordingly, the lattice constant a0 in the in-plane direction of the stabilization layer required to stabilize the CoFe alloy having the BCT structure is obtained by multiplying the lattice constant a1 of the CoFe alloy by the square root of 2. That is, the lattice constant a0 is aCoFe×0.905×1.414 Å≤a0≤aCoFe×0.969×1.414 Å. Since the lattice constant of $Co_XFe_{1-X}$ (0.4≤X≤0.6) is 2.843 Å≤aCoFe≤2.854 Å, the lattice constant a0 can be estimated as 3.637 Å≤a0≤3.911 Å.

(Materials of Stabilization Layers 11 & 15)

Materials indicated by (1) to (8) below can be used as the stabilization layers 11 and 15. The use of the materials indicated by (1) to (8) stabilizes the spin-polarization layers 12 and 14 by giving them the BCT structure.

(1) Nonmagnetic Metal

An example is a nonmagnetic metal mainly containing one or more elements selected from the group consisting of platinum (Pt), palladium (Pd), rhodium (Rh), and iridium (Ir).

(2) Ferromagnetic Alloy or Metal Capable of Forming $L1_0$ Alloy

An example is a ferromagnetic alloy mainly containing an alloy containing one or more elements selected from the first group consisting of iron (Fe), cobalt (Co), nickel (Ni), and copper (Cu), and one or more elements selected from the second group consisting of platinum (Pt), palladium (Pd), rhodium (Rh), and gold (Au). Practical examples are ferromagnetic alloys such as FeRh, FePt, FePd, CoPt, and NiPt.

(3) Oxide

An example is an oxide mainly containing one or more elements selected from the group consisting of zinc (Zn), strontium (Sr), ruthenium (Ru), barium (Ba), titanium (Ti), and calcium (Ca). Practical examples are SrRuO, SrTiO, BaTiO, CaTiO, RuTiO, and ZnO.

(4) Nitride

An example is a nitride mainly containing one or more elements selected from the group consisting of titanium (Ti), zirconium (Zr), niobium (Nb), vanadium (V), tantalum (Ta), boron (B), aluminum (Al), cerium (Ce), and lanthanum (La). Practical examples are TiN, ZrN, NbN, VN, TaN, BN, AlN, CeN, and LaN. It is also possible to use, e.g., GaN, InN, or TaN.

(5) Sulfide

An example is a sulfide mainly containing one or more elements selected from the group consisting of terbium (Tb), dysprosium (Dy), holmium (Ho), erbium (Er), thulium (Tm), and gadolinium (Gd). Practical examples are GdS, TbS, DyS, HoS, ErS, and TmS.

(6) Boride

An example is a boride mainly containing one or more elements selected from the group consisting of lanthanum (La), chromium (Cr), molybdenum (Mo), and tungsten (W). Practical examples are WB, MoB, CrB, and LaB.

(7) Carbide

An example is a carbide mainly containing one or more elements selected from the group consisting of titanium (Ti), tantalum (Ta), niobium (Nb), vanadium (V), and zirconium (Zr). Practical examples are TiC, TaC, NbC, VC, and ZrC.

(8) Silicide

An example is a silicide mainly containing one or more elements selected from the group consisting of molybdenum (Mo) and tungsten (W). Practical examples are MoSi and WSi.

The materials indicated by (3) to (8) each have a chemical bond that is a covalent bond or ion bond. Accordingly, the materials indicated by (3) to (8) each have a strong bond and stable structure compared to the materials indicated by (1) and (2). When using any of the materials indicated by (3) to (8) as the stabilization layer, therefore, it is possible to suppress the interdiffusion of atoms between the stabilization layer and spin-polarization layer, resulting in the advantage that the magnetic anisotropy of the spin-polarization layer can be maintained.

5. Arrangement of Nonmagnetic Layer (Tunnel Barrier Layer) 13

The nonmagnetic layer 13 is made of an insulating material, so a tunnel barrier layer is used as the nonmagnetic layer 13. The tunnel barrier layer 13 has a cubic crystal or tetragonal crystal as the primitive lattice. To obtain a high magnetoresistive ratio, the orientation of the tunnel barrier layer 13 must be improved, and the tunnel barrier layer 13 is desirably (001)-oriented in the direction perpendicular to the film surface.

An example of the tunnel barrier layer 13 is an oxide mainly containing one element selected from the group consisting of magnesium (Mg), calcium (Ca), barium (Ba), aluminum (Al), beryllium (Be), strontium (Sr), and titanium (Ti). Practical examples are MgO, CaO, BaO, AlO, BeO, SrO, and TiO. The tunnel barrier layer 13 may also be a mixed crystal of two or more materials selected from the above-mentioned oxide group.

The tunnel barrier layer 13 can be either crystalline or amorphous. When the tunnel barrier layer 13 has crystallized, however, the magnetoresistive ratio can be increased because only electrons having a specific wave number are selectively conducted by tunneling from the magnetic layer while maintaining the wave number.

Also, when the tunnel barrier layer 13 has crystallized, the interface between the spin-polarization layer and tunnel barrier layer has the epitaxial relationship in order to reduce the interface energy. Similar to the epitaxial relationship between the spin-polarization layer and stabilization layer, the spin-polarization layer is (001)-oriented in the direction perpendicular to the film surface on the tunnel barrier layer having the (001)-oriented upper surface, and, in the in-plane direction, grows at a rotational angle of 45° with respect to the [001] direction parallel to the film surface of the tunnel barrier layer. Especially when the lattice constant of the crystalline tunnel barrier layer is larger than that of the spin-polarization layer, the lattice constant of the spin-polarization layer in the in-plane direction increases following the lattice constant of the tunnel barrier layer, and meets c/a<1. Accordingly, no high magnetic anisotropy appears in the spin-polarization layer itself near the interface in contact with the crystalline tunnel barrier layer. Since, however, the interface of the spin-polarization layer on the opposite side in contact with the stabilization layer maintains c/a>1, the magnetization of the spin-polarization layer points in the direction perpendicular to the film surface by the magnetic interaction.

The tunnel barrier layer 13 may also be an amorphous tunnel barrier layer made of, e.g., AlO. When using the amorphous tunnel barrier layer 13, the spin-polarization layer can ignore the interface energy caused by the lattice misfit with the tunnel barrier layer 13. Therefore, the lattice strain generated by the stabilization layer can be stored to the vicinity of the interface with the tunnel barrier layer 13, so the magnetocrystalline anisotropy is not lost. As a consequence, the magnetization of the spin-polarization layer points in the direction perpendicular to the film surface.

6. Examples

Practical stacked structures of the perpendicular magnetization MTJ element 10 will now be explained as examples of the present invention. Perpendicular magnetization MTJ elements 10 were formed by forming the following magnetoresistive films (samples). A numerical value enclosed in the parentheses after each layer is the thickness (design value) of the layer when it was deposited. After being deposited, each sample was annealed in a vacuum at an appropriate temperature for an appropriate time so as to optimize the TMR characteristic and magnetic characteristic.

Practical Example 1

A practical example of the perpendicular magnetization MTJ element 10 having the structure shown in FIG. 2 as the basic configuration will be described below. Nonmagnetic layers were used as the stabilization layers 11 and 15.

The MTJ element 10 of Practical Example 1 was formed by including, from the uppermost layer, an Ir (3 nm) stabilization layer/CoFeB (0.5 nm) spin-polarization layer/MgO (1.5 nm) tunnel barrier layer/CoFeB (1 nm) spin-polarization layer/Ir (3 nm) stabilization layer/underlayer (not shown)/thermal oxide Si substrate (not shown).

The magnetization of the sample was measured by sweeping a magnetic field in the direction perpendicular to the film surface of the sample. Consequently, a magnetization curve reflecting that the residual magnetization in the first spin-polarization layer 12 pointed in the direction to the second spin-polarization layer 14 or the opposite direction to the second spin-polarization layer 14 was obtained. A magnetization curve reflecting that the residual magnetization in the second spin-polarization layer 14 pointed in the direction to the first spin-polarization layer 12 or the opposite direction to first spin-polarization layer 12 was obtained. From this result, it was possible to confirm that the perpendicular magnetization MTJ element including the spin-polarization layers 12 and 14 having magnetic anisotropy in the stacked direction (the direction perpendicular to the film surface) was formed.

Practical Example 2

A practical example of the perpendicular magnetization MTJ element 10 having the structure shown in FIG. 3 as the basic configuration will be described below.

The MTJ element 10 of Practical Example 2 was formed by including, from the uppermost layer, an FePt (3 nm) magnetic layer/MgO (1.5 nm) tunnel barrier layer/CoFeB (1 nm) spin-polarization layer/Ir (3 nm) stabilization layer/underlayer (not shown)/thermal oxide Si substrate (not shown).

The magnetization of the sample was measured by sweeping a magnetic field in the direction perpendicular to the film surface of the sample. Consequently, a magnetization curve reflecting that the residual magnetization in the spin-polarization layer 12 pointed in the direction to the magnetic layer 16 or the opposite direction to the magnetic layer 16 was obtained. A magnetization curve reflecting that the residual magnetization in the magnetic layer 16 pointed in the direction to the spin-polarization layer 12 or the opposite direction to the spin-polarization layer 12 was obtained. From this result, it was possible to confirm that the perpendicular magnetization MTJ element 10 including the spin-polarization layer 12 and magnetic layer 16 having magnetic anisotropy in the stacked direction was formed.

Practical Example 3

A practical example of the perpendicular magnetization MTJ element 10 having the structure shown in FIG. 2 as the basic configuration will be described below. Ferromagnetic layers were used as the stabilization layers 11 and 15.

The MTJ element 10 of Practical Example 3 was formed by including, from the uppermost layer, an FePt (3 nm) stabilization layer/Fe (1 nm) spin-polarization layer/MgO (1.5 nm) tunnel barrier layer/CoFeB (1 nm) spin-polarization layer/FePd (3 nm) stabilization layer/underlayer (not shown)/thermal oxide Si substrate (not shown).

The magnetization of the sample was measured by sweeping a magnetic field in the direction perpendicular to the film surface of the sample. Consequently, a magnetization curve reflecting that the residual magnetization in the first spin-polarization layer 12 pointed in the direction to the second spin-polarization layer 14 or the opposite direction to the second spin-polarization layer 14 was obtained. A magnetization curve reflecting that the residual magnetization in the second spin-polarization layer 14 pointed in the direction to the first spin-polarization layer 12 or the opposite direction to the first spin-polarization layer 12 was obtained. From this result, it was possible to confirm that the perpendicular magnetization MTJ element 10 including the spin-polarization layers 12 and 14 having magnetic anisotropy in the stacked direction was formed.

Practical Example 4

A practical example of the perpendicular magnetization MTJ element 10 having the structure shown in FIG. 2 as the basic configuration will be described below. Ferromagnetic layers were used as the stabilization layers 11 and 15.

The MTJ element 10 of Practical Example 4 was formed by including, from the uppermost layer, an FePt (3 nm) stabilization layer/Fe (1 nm) spin-polarization layer/MgO (1.5 nm) tunnel barrier layer/$Co_{48}Fe_{32}B_{20}$ (0.5 nm)/$Co_{56}FE_{24}B_{20}$ (0.5 nm) spin-polarization layer/FePd (3 nm) stabilization layer/underlayer (not shown)/thermal oxide Si substrate (not shown).

The magnetization of the sample was measured by sweeping a magnetic field in the direction perpendicular to the film surface of the sample. Consequently, a magnetization curve reflecting that the residual magnetization in the first spin-polarization layer 12 pointed in the direction to the second spin-polarization layer 14 or the opposite direction to the second spin-polarization layer 14 was obtained. A magnetization curve reflecting that the residual magnetization in the second spin-polarization layer 14 pointed in the direction to the first spin-polarization layer 12 or the opposite direction to the first spin-polarization layer 12 was obtained. From this result, it was possible to confirm that the perpendicular magnetization MTJ element including the spin-polarization layers 12 and 14 having magnetic anisotropy in the stacked direction was formed.

As described above, each of these examples (Practical Examples 1 to 4) can implement the perpendicular magnetization MTJ element 10 that exhibits a giant magnetoresistive effect.

7. Effects

In this embodiment as described in detail above, the perpendicular magnetic anisotropy appears in the spin-polarization layer 12 itself. To this end, the spin-polarization layer 12 having the BCT structure obtained by extending the BCC structure in the z-axis direction is formed by straining the spin-polarization layer 12 in the z-axis direction. Also, the composition ratio of the spin-polarization layer 12 is set in the range within which the magnetocrystalline anisotropy increases. In addition, the lattice constant of the stabilization layer 11 is set smaller than that of the spin-polarization layer 12. The spin-polarization layer 12 formed on the stabilization layer 11 and compressed in the in-plane direction is stabilized by being given the BCT structure. This similarly applies to the relationship between the spin-polarization layer 14 and stabilization layer 15. Furthermore, the spin-polarization layers 12 and 14 each are made of a highly spin-polarization material.

In this embodiment, therefore, a large TMR effect appears because the interface polarization ratio between the spin-polarization layer and tunnel barrier layer can be increased. This makes it possible to increase the magnetoresistive ratio of the MTJ element 10.

Also, the thickness of the spin-polarization layer can be increased because the perpendicular magnetic anisotropy can be given to the highly spin-polarization material itself. This makes it possible to form a perpendicular magnetization MTJ element having a high magnetoresistive effect while maintaining the perpendicular magnetization.

Additionally, the damping constant can be reduced because light metals such as Co and Fe are used as the spin-polarization layers 12 and 14. Accordingly, the MTJ element 10 can achieve spin transfer magnetization reversal.

Second Embodiment

The MTJ element 10 disclosed in the first embodiment is applicable to an MRAM, a magnetic head of a magnetic disc apparatus, and the like.

A memory element forming an MRAM includes a recording layer in which the magnetization (or spin) direction is variable (reversal), a reference layer in which the magnetization direction is invariable (fixed), and a nonmagnetic layer sandwiched between the recording layer and reference layer. "The magnetization direction in the reference layer is invariable" means that the magnetization direction in the reference layer does not vary when a magnetization switching current used to reverse the magnetization direction in the recording layer is supplied to the reference layer. An MRAM using the MTJ element 10 as a memory element can be formed by using one of spin-polarization layers 12 and 14 having perpendicular magnetic anisotropy as the recording layer, and the other as the reference layer.

More specifically, the spin-polarization layers 12 and 14 can be used as the recording layer and reference layer by producing a coercive force difference between them. Accordingly, by using a magnetic layer having a large switching current as the spin-polarization layer (reference layer) 12 and a magnetic layer having a reversing current smaller than that of the reference layer 12 as the spin-polarization layer (recording layer) 14 in the MTJ element 10, it is possible to implement the MTJ element 10 including the recording layer 14 having a variable magnetization direction and the reference layer 12 having an invariable magnetization direction. When causing magnetization reversal by spin-polarized electrons, a magnetocrystalline anisotropy difference can be produced by, e.g., adjusting the compositions of the materials forming the spin-polarization layers 12 and 14. This makes it possible to produce a difference between the switching currents of the spin-polarization layers 12 and 14.

As described previously, stabilization layers 11 and 15 may also be used as the reference layer and recording layer when ferromagnetic materials are used as the stabilization layers 11 and 15. A coercive force difference need only be produced between the stabilization layers 11 and 15 in this case as well. It is also possible to use a magnetic material combining the stabilization layer 11 and spin-polarization layer 12 as the reference layer (or recording layer), and a magnetic material combining the stabilization layer 15 and spin-polarization layer 14 as the recording layer (or reference layer). Furthermore, in the arrangement shown in FIG. 3, it is possible to use one of the magnetic layer 16 and spin-polarization layer 12 as the reference layer and the other as the recording layer by producing a coercive force difference between the magnetic layer 16 and spin-polarization layer 12.

Figure 4:
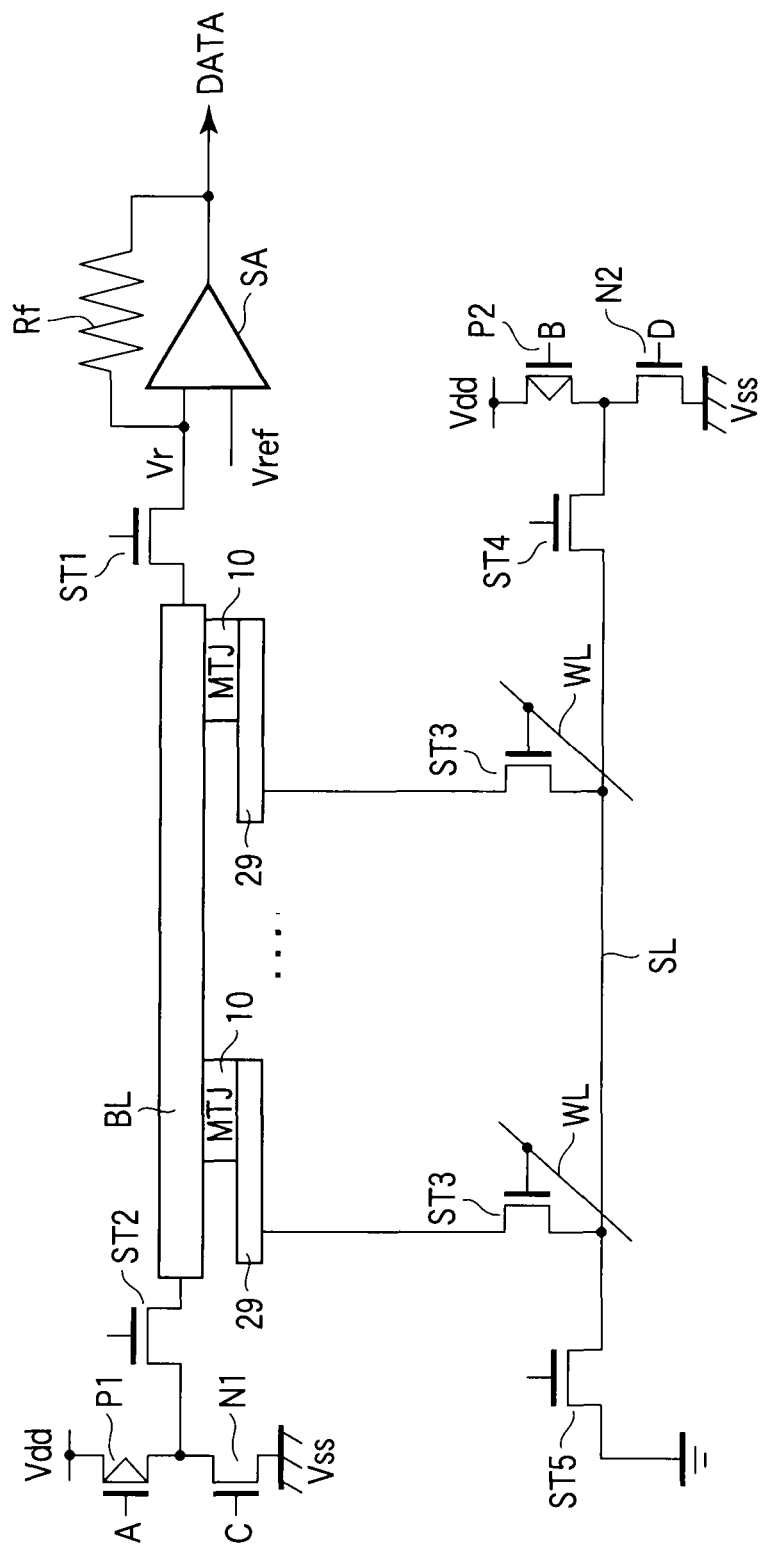
FIG. 4 is a circuit diagram illustrating the arrangement of an MRAM according to a second embodiment.

FIG. 4 is a circuit diagram showing the arrangement of the MRAM according to the second embodiment. One terminal of the MTJ element 10 is electrically connected to a bit line BL. One end of the bit line BL is electrically connected to a sense amplifier SA via an N-channel MOS transistor ST1 as a selection switch. The sense amplifier SA compares a read potential Vr from the MTJ element 10 with a reference potential Vref, and outputs the comparison result as an output signal DATA. A resistor Rf electrically connected to the sense amplifier SA is a feedback resistor.

The other end of the bit line BL is electrically connected to the drain of a P-channel MOS transistor P1 and the drain of an N-channel MOS transistor N1 via an N-channel MOS transistor ST2 as a selection switch. The source of MOS transistor P1 is connected to a power terminal Vdd. The source of MOS transistor N1 is connected to a ground terminal Vss.

The other terminal of the MTJ element 10 is electrically connected to a lower electrode 29. The lower electrode 29 is electrically connected to a source line SL via an N-channel MOS transistor ST3 as a selection switch. Note that the source line SL runs parallel to the bit line BL.

The source line SL is electrically connected to the drain of a P-channel MOS transistor P2 and the drain of an N-channel MOS transistor N2 via an N-channel MOS transistor ST4 as a selection switch. The source of MOS transistor P2 is connected to the power terminal Vdd. The source of MOS transistor N2 is connected to the ground terminal Vss. The source line SL is connected to the ground terminal Vss via an N-channel MOS transistor ST5 as a selection switch.

The gate of MOS transistor ST3 is electrically connected to a word line WL. The word line WL runs in a direction crossing the direction in which the bit line BL runs.

Data is written in the MTJ element 10 by the spin transfer writing method. That is, data is written by controlling the direction of a write current flowing through the MTJ element 10 by turning on and off MOS transistors P1, P2, N1, and N2 by control signals A, B, C, and D.

Data is read from the MTJ element 10 by supplying a read current to the MTJ element 10. The magnitude of the read current is set smaller than that of the write current. The magnetoresistive effect changes the resistance of the MTJ element 10 in accordance with whether the magnetization directions in the reference layer and recording layer are parallel or antiparallel. That is, the resistance of the MTJ element 10 is minimum when the magnetization directions in the reference layer and recording layer are parallel, and maximum when they are antiparallel. A binary digit recorded in the MTJ element 10 is read by detecting this change in resistance by the sense amplifier SA.

Figure 5:
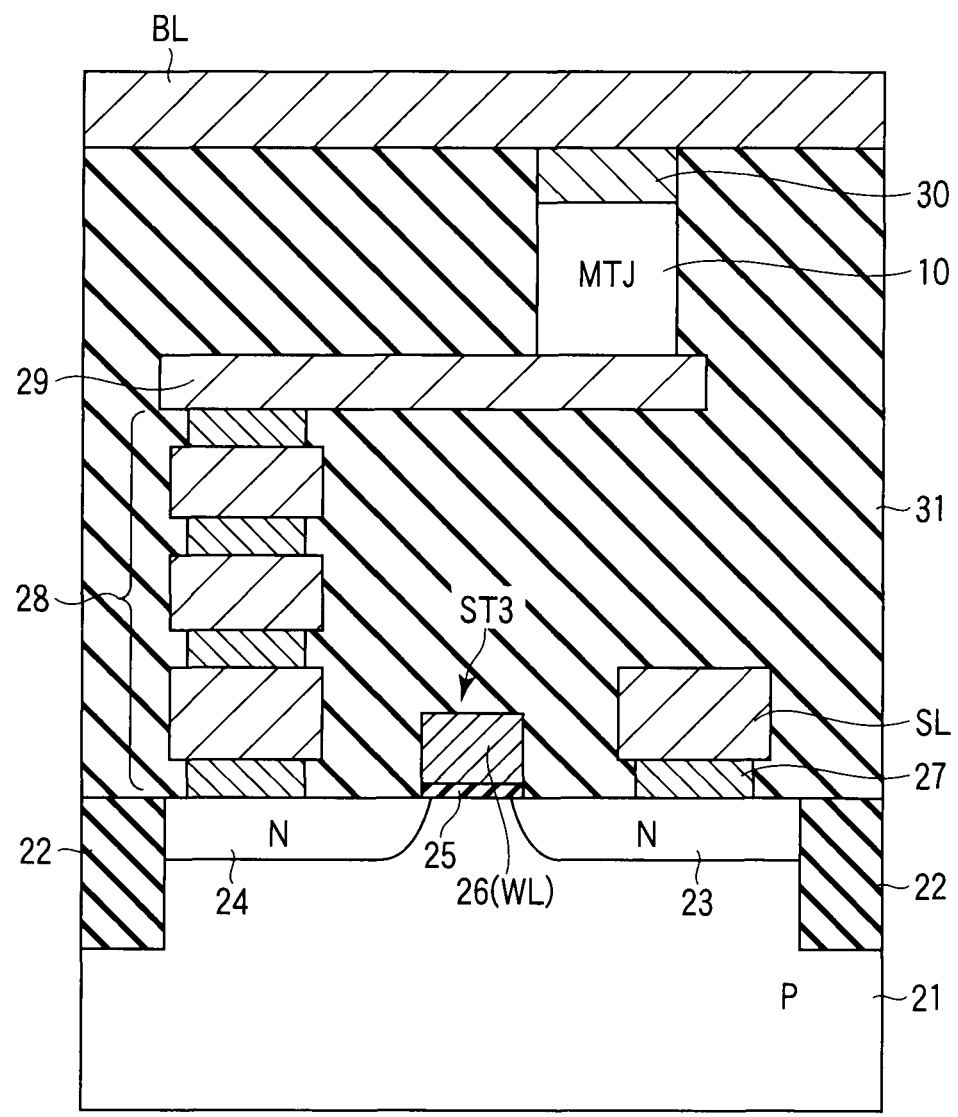
FIG. 5 is a sectional view illustrating the arrangement of the MRAM.

FIG. 5 is a sectional view showing the arrangement of the MRAM. Element isolation insulating layers 22 having a shallow trench isolation (STI) structure are formed in a P-type semiconductor substrate 21. The N-channel MOS transistor ST3 as a selection transistor is formed in an element area (active area) surrounded by the element isolation insulating layers 22. MOS transistor ST3 has diffusion regions 23 and 24 as the source/drain regions, a gate insulating film 25 formed on a channel region between the diffusion regions 23 and 24, and a gate electrode 26 formed on the gate insulating film 25. The gate electrode 26 corresponds to the word line WL shown in FIG. 4.

A contact plug 27 is formed on the diffusion region 23. The source line SL is formed on the contact plug 27. A contact plug 28 is formed on the diffusion region 24. The lower electrode 29 is formed on the contact plug 28. The MTJ element 10 is formed on the lower electrode 29. An upper electrode 30 is formed on the MTJ element 10. The bit line BL is formed on the upper electrode 30. A portion between the semiconductor substrate 21 and bit line BL is filled with an interlayer insulating layer 31.

The stress can be controlled by adjusting the formation conditions of the interlayer insulating layer 31. This makes it possible to directly apply the stress from the interlayer insulating layer 31 to the spin-polarization layer and stabilization layer of the MTJ element 10, and compress the spin-polarization layer and stabilization layer. Accordingly, the interlayer insulating layer 31 can be given not only the original function of effectively electrically insulating the MTJ element 10, but also the function of effectively stabilizing the strain of the spin-polarization layer.

Figure 6:
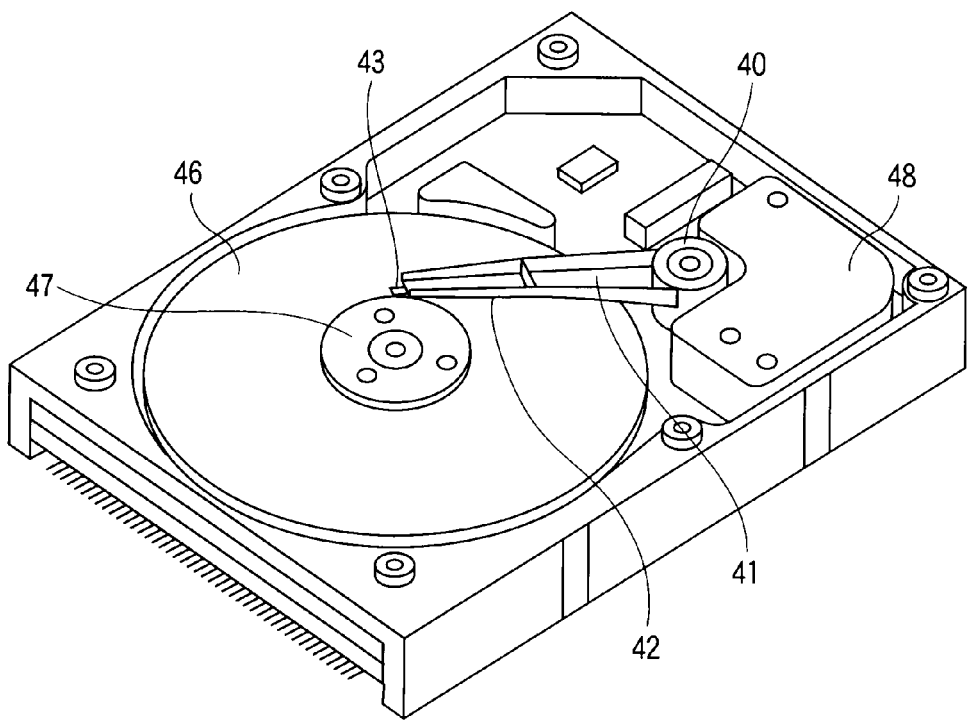
FIG. 6 is a schematic view illustrating the structure of a magnetic disc apparatus according to the second embodiment.
Figure 7:
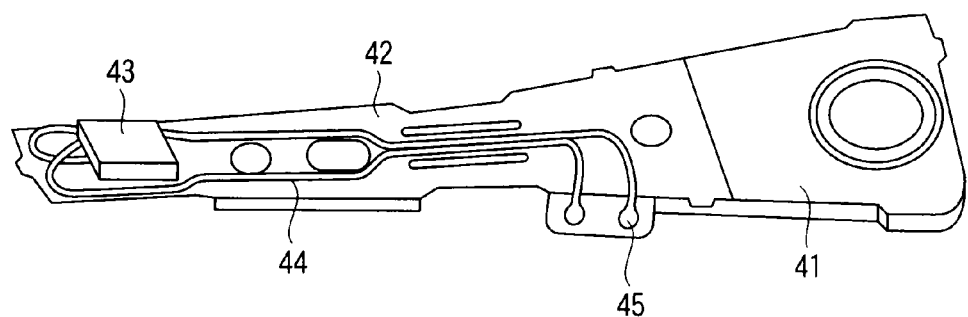
FIG. 7 is a schematic view illustrating the structure of a magnetic head assembly incorporating a TMR head.

FIG. 6 is a schematic view showing the structure of a magnetic disc apparatus according to the second embodiment. FIG. 7 is a schematic view showing the structure of a magnetic head assembly incorporating a TMR head. An actuator arm 41 has a hole for fixing the actuator arm 41 to a fixing shaft 40 in the magnetic disc apparatus. A suspension 42 is connected to one end of the actuator arm 41.

A head slider 43 incorporating the TMR head is attached to the distal end of the suspension 42. Also, lead lines 44 for data write/read are connected to the suspension 42. One end of each of the lead lines 44 is electrically connected to the electrode of the TMR head incorporated in the head slider 43. The TMR head includes the MTJ element 10 of the present invention. The other end of each of the lead lines 44 is electrically connected to an electrode pad 45.

A magnetic disc 46 is fitted on a spindle 47 and driven by a motor in accordance with a control signal from a driving controller. The head slider 43 floats by a predetermined amount by the rotation of the magnetic disc 46. In this state, data is recorded and reproduced by using the TMR head.

The actuator arm 41 has a bobbin holding a driving coil. A voice coil motor 48 as a kind of a linear motor is connected to the actuator arm 41. The voice coil motor 48 includes the driving coil wound around the bobbin of the actuator arm 41, and a magnetic circuit including a permanent magnet and counter yoke facing each other so as to sandwich the driving coil. The actuator arm 41 is held by ball bearings formed in two, upper and lower portions of the fixing shaft 40, and driven by the voice coil motor 48.

The MRAM and magnetic disc apparatus have been explained above as application examples of the present invention. However, the present invention is also applicable to general devices using the TMR effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a stabilization layer;
a nonmagnetic layer;
a spin-polarization layer provided between the stabilization layer and the nonmagnetic layer, the spin-polarization layer having magnetic anisotropy in a perpendicular direction and comprising a ferromagnetic material; and
a magnetic layer provided on a side of the nonmagnetic layer opposite to a side on which the spin-polarization layer is provided,
wherein the stabilization layer has a lattice constant smaller than that of the spin-polarization layer in an in-plane direction, and
the spin-polarization layer contains at least one element selected from a group consisting of cobalt (Co) and iron (Fe), has a body-centered tetragonal (BCT) structure, and has a lattice constant ratio c/a of 1.10 (inclusive) to 1.35 (inclusive) when the perpendicular direction is a c-axis and the in-plane direction is an a-axis.

2. The element according to claim 1, wherein the spin-polarization layer is made of a $Co_xFe_{1-x}$ alloy, and has a composition ratio of $0.4 \leq X \leq 0.6$.

3. The element according to claim 1, wherein the spin-polarization layer contains at least one element selected from a group consisting of nickel (Ni), tantalum (Ta), chromium (Cr), boron (B), phosphorus (P), carbon (C), silicon (Si), molybdenum (Mo), zirconium (Zr), platinum (Pt), palladium (Pd), rhodium (Rh), and gold (Au).

4. The element according to claim 1, wherein the stabilization layer is (001)-oriented in a perpendicular direction, and has a lattice constant of 3.637 (inclusive) to 3.911 (inclusive) Å in an in-plane direction.

5. The element according to claim 1, wherein the stabilization layer contains at least one element selected from a group consisting of platinum (Pt), palladium (Pd), rhodium (Rh), and iridium (Ir).

6. The element according to claim 1, wherein the stabilization layer contains an alloy of at least one element selected from a first group consisting of iron (Fe), cobalt (Co), nickel (Ni), and copper (Cu), and at least one element selected from a second group consisting of platinum (Pt), palladium (Pd), rhodium (Rh), and gold (Au).

7. A magnetoresistive element comprising:
first and second stabilization layers;
a nonmagnetic layer;
a first spin-polarization layer provided between the first stabilization layer and the nonmagnetic layer, the first spin-polarization layer having magnetic anisotropy in a perpendicular direction and comprising a ferromagnetic material; and
a second spin-polarization layer provided between the second stabilization layer and the nonmagnetic layer, the second spin-polarization layer having magnetic anisotropy in the perpendicular direction and comprising a ferromagnetic material,
wherein the first stabilization layer has a lattice constant smaller than that of the first spin-polarization layer in an in-plane direction,
the second stabilization layer has a lattice constant smaller than that of the second spin-polarization layer in the in-plane direction, and
each of the first and second spin-polarization layers contains at least one element selected from a group consisting of cobalt (Co) and iron (Fe), has a body-centered tetragonal (BCT) structure, and has a lattice constant ratio c/a of 1.10 (inclusive) to 1.35 (inclusive) when the perpendicular direction is a c-axis and in-plane direction is an a-axis.

8. The element according to claim 7, wherein the spin-polarization layer is made of a $Co_xFe_{1-x}$ alloy, and has a composition ratio of $0.4 \leq X \leq 0.6$.

9. The element according to claim 7, wherein the spin-polarization layer contains at least one element selected from a group consisting of nickel (Ni), tantalum (Ta), chromium (Cr), boron (B), phosphorus (P), carbon (C), silicon (Si), molybdenum (Mo), zirconium (Zr), platinum (Pt), palladium (Pd), rhodium (Rh), and gold (Au).

10. The element according to claim 7, wherein the stabilization layer is (001)-oriented in a perpendicular direction, and has a lattice constant of 3.637 (inclusive) to 3.911 (inclusive) Å in an in-plane direction.

11. The element according to claim 7, wherein the stabilization layer contains at least one element selected from a group consisting of platinum (Pt), palladium (Pd), rhodium (Rh), and iridium (Ir).

12. A magnetic memory comprising a memory cell comprising a magnetoresistive element,
the magnetoresistive element comprising:
a stabilization layer;
a nonmagnetic layer;
a spin-polarization layer provided between the stabilization layer and the nonmagnetic layer, the spin-polarization layer having magnetic anisotropy in a perpendicular direction and comprising a ferromagnetic material; and
a magnetic layer provided on a side of the nonmagnetic layer opposite to a side on which the spin-polarization layer is provided,
wherein the stabilization layer has a lattice constant smaller than that of the spin-polarization layer in an in-plane direction, and
the spin-polarization layer contains at least one element selected from a group consisting of cobalt (Co) and iron (Fe), has a body-centered tetragonal (BCT) structure, and has a lattice constant ratio c/a of 1.10 (inclusive) to 1.35 (inclusive) when the perpendicular direction is a c-axis and the in-plane direction is an a-axis.

13. The element according to claim 1, wherein the stabilization layer is in contact with the spin polarization layer.

14. The element according to claim 7, wherein
the first stabilization layer is in contact with the first spin polarization layer, and
the second stabilization layer is in contact with the second spin polarization layer.

15. The memory according to claim 12, wherein the stabilization layer is in contact with the spin polarization layer.

16. The element according to claim 1, wherein the BCT structure is obtained by extending the lattice constant of the spin-polarization layer in the c-axis direction.

17. The element according to claim 7, wherein the BCT structure is obtained by extending the lattice constant of the spin-polarization layer in the c-axis direction.

18. The memory according to claim 12, wherein the BCT structure is obtained by extending the lattice constant of the spin-polarization layer in the c-axis direction.

* * * * *